US009305977B1

(12) United States Patent
Hsu

(10) Patent No.: US 9,305,977 B1
(45) Date of Patent: Apr. 5, 2016

(54) RESISTIVE RANDOM ACCESS MEMORY AND METHOD FOR MANUFACTURING THE SAME

(71) Applicant: Powerchip Technology Corporation, Hsinchu (TW)

(72) Inventor: Mao-Teng Hsu, Taipei (TW)

(73) Assignee: Powerchip Technology Corporation, Hsinchu (TW)

( * ) Notice: Subject to any disclaimer, the term of this patent is extended or adjusted under 35 U.S.C. 154(b) by 0 days.

(21) Appl. No.: 14/583,180

(22) Filed: Dec. 25, 2014

(30) Foreign Application Priority Data

Oct. 28, 2014 (TW) .............................. 103137209 A

(51) Int. Cl.
*H01L 27/24* (2006.01)
*H01L 45/00* (2006.01)

(52) U.S. Cl.
CPC ........ *H01L 27/2481* (2013.01); *H01L 45/1233* (2013.01); *H01L 45/16* (2013.01)

(58) Field of Classification Search
CPC ... H01L 27/2463; H01L 45/08; H01L 45/146; H01L 45/246; H01L 27/2454; H01L 27/2481
USPC ............................................. 257/5, 314–321
See application file for complete search history.

(56) References Cited

U.S. PATENT DOCUMENTS

| 2012/0327701 | A1 | 12/2012 | Nazarian |
| 2013/0240821 | A1 | 9/2013 | Toh et al. |
| 2014/0145137 | A1* | 5/2014 | Ju .......................... H01L 45/08 257/2 |
| 2015/0214478 | A1* | 7/2015 | Lee ..................... H01L 45/1233 257/5 |
| 2015/0255511 | A1* | 9/2015 | Takagi ................... H01L 45/08 365/63 |

OTHER PUBLICATIONS

I. G. Baek, et al., "Realization of Vertical Resistive Memory (VRRAM) using cost effective 3D Process," 2011 IEEE International Electron Devices Meeting (IEDM), Dec. 5-7, 2011, pp. 31.8.1-31.8.4.
W.C. Chien, et al., "Multi-Layer Sidewall WOx Resistive Memory Suitable for 3D ReRAM," 2012 Symposium on VLSI Technology (VLSIT), Jun. 12-14, 2012 , pp. 153-154.
Leqi Zhang, et al., "Analysis of Vertical Cross-Point Resistive Memory (VRRAM) for 3D RRAM Design," 2013 5th IEEE International Memory Workshop (IMW), May 26-29, 2013, pp. 155-158.

* cited by examiner

*Primary Examiner* — Brook Kebede
(74) *Attorney, Agent, or Firm* — Jianq Chyun IP Office

(57) ABSTRACT

A resistive random access memory including a substrate, a dielectric layer disposed on the substrate and at least one memory cell string is provided. The memory cell string includes memory cells and second vias. The memory cells are vertically and adjacently disposed in the dielectric layer, and each of the memory cells includes a first via, two conductive lines respectively disposed at two sides of the first via and two variable resistance structures respectively disposed between the first via and the conductive lines. In the vertically adjacent two memory cells, the variable resistance structures of the upper memory cell and the variable resistance structures of the lower memory cell are isolated from each other. The second vias are respectively disposed in the dielectric layer under the first vias and connected to the first vias, and the vertically adjacent two first vias are connected by the second via.

20 Claims, 14 Drawing Sheets

RESISTIVE RANDOM ACCESS MEMORY AND METHOD FOR MANUFACTURING THE SAME

CROSS-REFERENCE TO RELATED APPLICATION

This application claims the priority benefit of Taiwan application serial no. 103137209, filed on Oct. 28, 2014. The entirety of the above-mentioned patent application is hereby incorporated by reference herein and made a part of this specification.

BACKGROUND OF THE INVENTION

1. Field of the Invention

The invention relates to a memory and a method for manufacturing the same, and more particularly, relates to a resistive random access memory and a method for manufacturing the same.

2. Description of Related Art

A non-volatile memory is characterized by storing data even when the power is off, and thus the non-volatile memory has become a mandatory memory in many electronic products for providing normal operation when the electronic products are booted. Currently, a resistive random access memory (RRAM) is a non-volatile memory under positive developments in the industry, which has advantages including low writing operation voltage, short write/erase time, long memorizing time, non-destructive read out, multi-state memory, simple structure, less required area and so on. As such, the RRAM may become one of the non-volatile memories widely used by personal computers and other electronic equipments in the future.

In order to increase a density of the memory, a 3D resistive random access memory (3D RRAM) of vertical arrangement in high density has been proposed by the industry. However, the 3D RRAM usually requires a deep etching process and a deep filling process to be performed, which means that it cannot be directly integrated with an advanced logic process.

SUMMARY OF THE INVENTION

The invention is directed to a resistive random access memory and a method for manufacturing the same, which are capable of being directly integrated with the advanced logic process.

The invention provides a resistive random access memory, which includes a substrate, a dielectric layer and at least one memory cell string. The dielectric layer is disposed on the substrate. The memory cell string includes a plurality of memory cells and a plurality of second vias. The memory cells are vertically and adjacently disposed in the dielectric layer, and each of the memory cells includes a first via, two conductive lines and two variable resistance structures. The conductive lines are respectively disposed at two sides of the first via. The variable resistance structures are respectively disposed between the first via and the conductive lines. In the vertically adjacent two memory cells, the variable resistance structures of the upper memory cell and the variable resistance structures of the lower memory cell are isolated from each other. The second vias are respectively disposed in the dielectric layer under the first vias and connected to the first vias, and the vertically adjacent two first vias are connected by one of the second vias.

According to an embodiment of the invention, in the resistive random access memory, a width of the first vias is, for example, greater than a width of the second vias.

According to an embodiment of the invention, in the resistive random access memory, a bottom surface of the conductive line is, for example, higher than a top surface of the second via under the conductive line.

According to an embodiment of the invention, in the resistive random access memory, the variable resistance structure includes a variable resistance layer.

According to an embodiment of the invention, in the resistive random access memory, the variable resistance structure further includes an insulation layer which is disposed between the variable resistance layer and the first via or between the variable resistance layer and the conductive line.

According to an embodiment of the invention, in the resistive random access memory, when the at test one memory cell string is a plurality of memory cell strings, the horizontally adjacent two memory cells share the conductive line disposed therebetween.

According to an embodiment of the invention, in the resistive random access memory, a shape of the conductive line is, for example, a strip shape or a finger shape.

According to an embodiment of the invention, the resistive random access memory further includes at least one transistor which is disposed on the substrate, and one terminal of the at least one transistor is electrically connected to one of the first vias by one of the second vias.

According to an embodiment of the invention, in the resistive random access memory, when the at least one transistor is a plurality of transistors, at least one isolation structure is further included. The isolation structure is disposed in the substrate, and the transistors are isolated from one another by the isolation structure.

The invention provides a method for manufacturing a resistive random access memory, which includes the following steps. A dielectric layer is formed on a substrate. At least one memory cell string is formed in the dielectric layer. The memory cell string includes a plurality of memory cells and a plurality of second vias. The memory cells are vertically and adjacently disposed in the dielectric layer, and each of the memory cells includes a first via, two conductive lines and two variable resistance structures. The conductive lines are respectively disposed at two sides of the first via. The variable resistance structures are respectively disposed between the first via and the conductive lines. In the vertically adjacent two memory cells, the variable resistance structures of the upper memory cell and the variable resistance structures of the lower memory cell are isolated from each other. The second vias are respectively disposed in the dielectric layer under the first vias and connected to the first vias, and the vertically adjacent two first vias are connected by one of the second vias.

According to an embodiment of the invention, in the method for manufacturing the resistive random access memory, a forming method of the dielectric layer is, for example, a chemical vapor deposition.

According to an embodiment of the invention, in the method for manufacturing the resistive random access memory, a forming method of the first vias includes a combination of a photolithography process, an etching process and a deposition process, or includes a damascene process.

According to an embodiment of the invention, in the method for manufacturing the resistive random access memory, a width of the first via is, for example, greater than a width of the second via.

According to an embodiment of the invention, in the method for manufacturing the resistive random access memory, a forming method of the conductive lines includes the following steps. The dielectric layer at the two sides of each of the first vias is removed in order to form an opening at each of the two sides of each of the first vias. A conductive line material layer filling the openings is formed. The conductive line material layer disposed outside of the openings is removed.

According to an embodiment of the invention, in the method for manufacturing the resistive random access memory, a bottom portion of the opening is, for example, higher than a bottom surface of the first via.

According to an embodiment of the invention, in the method for manufacturing the resistive random access memory, a forming method of the variable resistance structures includes the following steps. A conformal variable resistance material layer is formed on the first vias. An etch-back process is performed on the variable resistance material layer.

According to an embodiment of the invention, in the method for manufacturing the resistive random access memory, the forming method of the variable resistance structure further includes before or after forming the variable resistance material layer, forming a conformal insulation material layer on the first vias.

According to an embodiment of the invention, in the method for manufacturing the resistive random access memory, a forming method of the second vias includes a combination of a photolithography process, an etching process and a deposition process, or includes a damascene process.

According to an embodiment of the invention, the method for manufacturing the resistive random access memory further includes: before forming ring the dielectric layer, forming at least one transistor on the substrate, wherein one terminal of the transistor is electrically connected to one of the first vias by one of the second vias.

According to an embodiment of the invention, in the method for manufacturing the resistive random access memory, when the at least one transistor is a plurality of transistors, the method further includes forming at least one isolation structure in the substrate, and the transistors are isolated from one another by the isolation structure.

Based on the above, in the resistive random access memory and the method for manufacturing the same as provided by the invention, in the vertically adjacent two memory cells, the variable resistance structures of the upper memory cell and the variable resistance structures of the lower memory cell are isolated from each other, and the vertically adjacent two first vias are connected by one of the second via. Therefore, a deep etching process and a deep filling process are not required during the manufacturing process of the resistive random access memory. Accordingly, the manufacturing process of the resistive random access memory can be directly integrated with the advanced logic process (e.g., the complementary metal oxide semiconductor (CMOS) logic process).

To make the above features and advantages of the disclosure more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
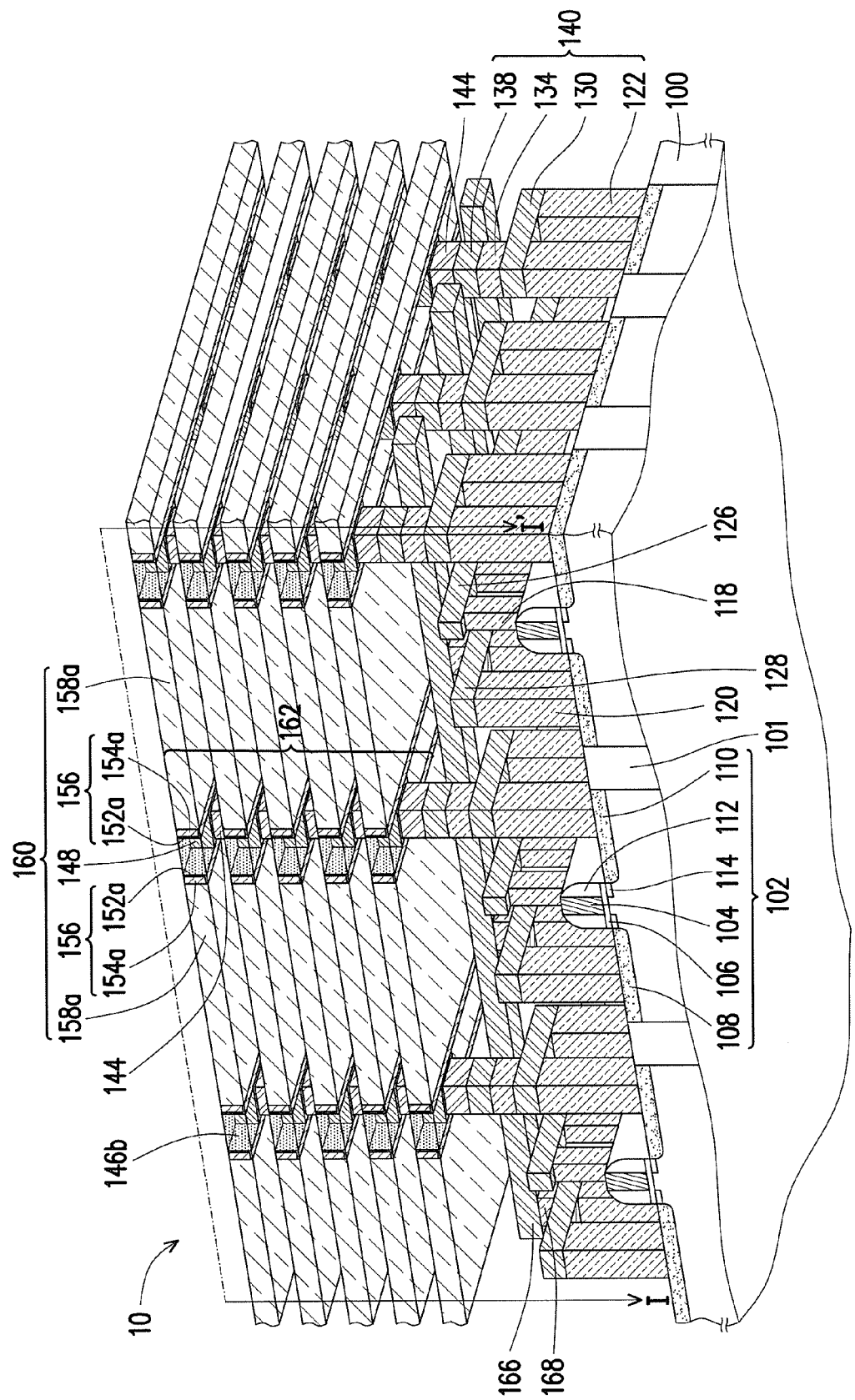
FIG. 1 is a 3D diagram illustrating a resistive random access memory according to an embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1 is a 3D diagram illustrating a resistive random access memory according to an embodiment of the invention. In FIG. 1, for clear descriptions, only a dielectric layer between variable resistance structures at two sides of a via is illustrated. FIG. 2A to FIG. 2F are top views illustrating a flow of a manufacturing process of the resistive random access memory in FIG. 1. FIG. 3A to FIG. 3F are cross-sectional views illustrating a flow of the manufacturing process of the resistive random access memory along the section line I-I' in FIG. 1. FIG. 4 is a top view of conductive lines according to another embodiment of the invention.

Figure 2A:
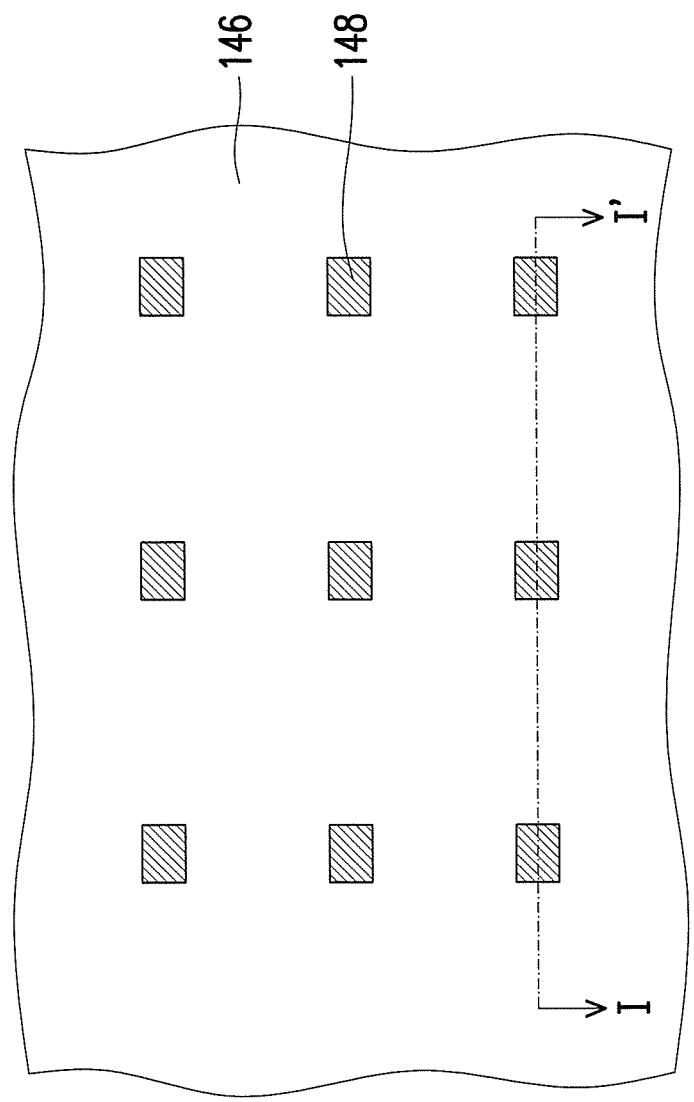
FIG. 2A to FIG. 2F are top views illustrating a flow of a manufacturing process of the resistive random access memory in FIG. 1.
Figure 3A:
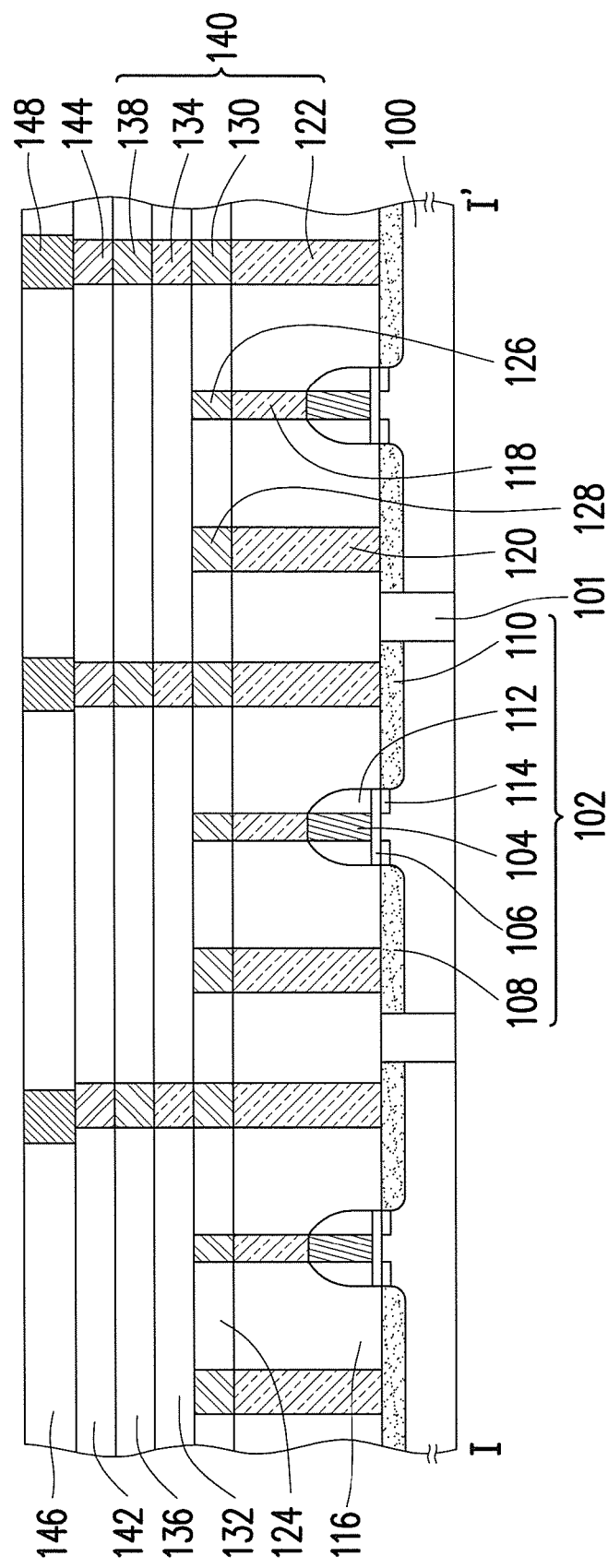
FIG. 3A to FIG. 3F are cross-sectional views illustrating a flow of the manufacturing process of the resistive random access memory along the section line I-I' in FIG. 1.
Figure 4:
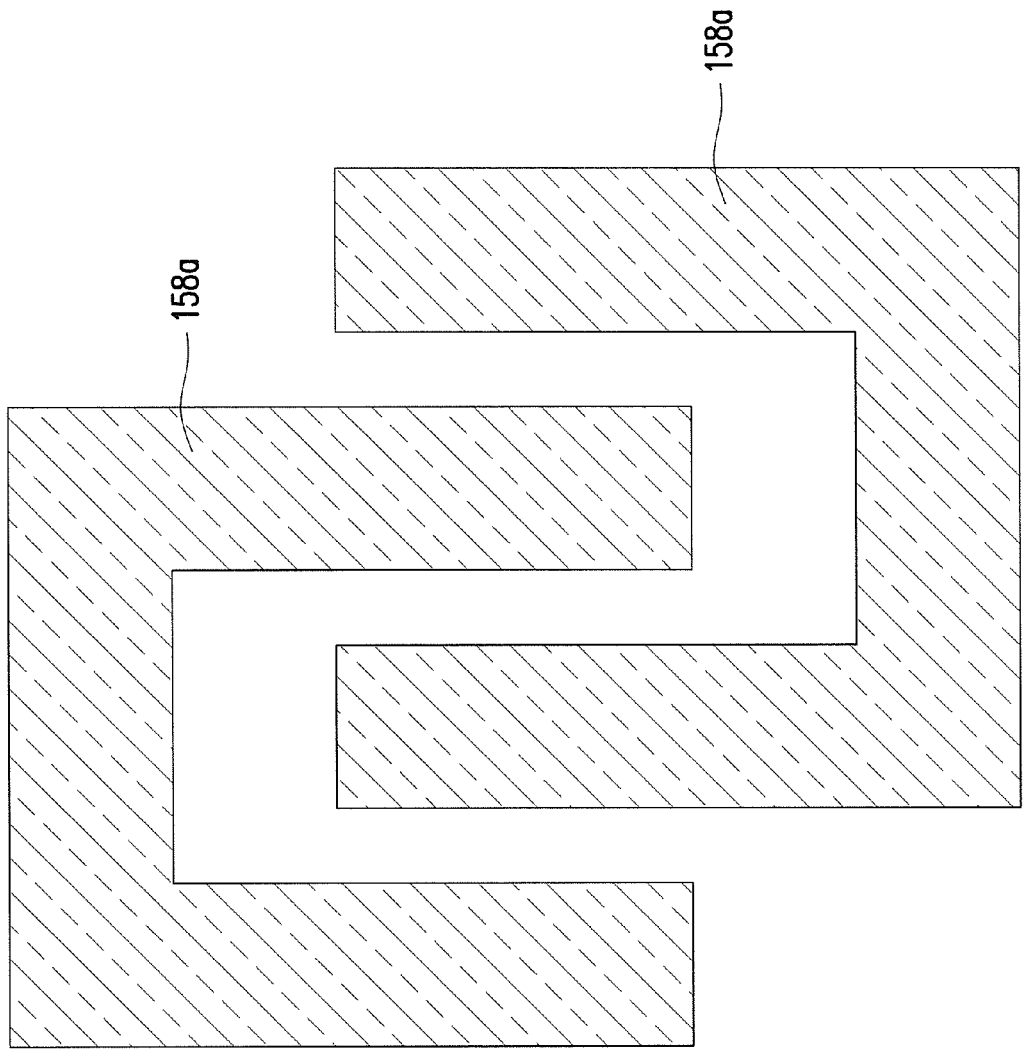
FIG. 4 is a top view of conductive lines according to another embodiment of the invention.

First of all, referring to FIG. 1, FIG. 2A and FIG. 3A together, at least one transistor 102 is optionally formed on a substrate 100. The transistor 102 is, for example, a metal oxide semiconductor field effect transistor (MOSFET) or a bipolar junction transistor (BJT). In this embodiment, three transistors 102 are formed for example, but the invention is not limited thereto.

In this embodiment, the transistor 102 is illustrated as the metal oxide semiconductor field effect transistor for example, but the invention is not limited thereto. The transistor 102 includes a gate 104, a gate dielectric layer 106, doped regions 108 and 110, a spacer 112 and a doped extension region 114. The gate dielectric layer 106 is disposed between the gate 104 and the substrate 100. The doped regions 108 and 110 are respectively disposed in the substrate 100 at two sides of the gate 104. In this embodiment, the doped regions 108 and 110 can serve as terminals of the transistor 102. For instance, the doped region 108 can be used as a source, and the doped region 110 can be used as a drain. The spacer 112 is disposed on the substrate 100 at the two sides of the gate 104. The doped extension region 114 is disposed in the substrate 100 under the spacer 112, and can be used as a lightly doped drain (LDD). The material and the forming method of each component in the transistor 102 are well-known to persons of ordinary skill in the art, and thus related descriptions thereof are omitted hereinafter.

In addition, before forming the transistors 102, at least one isolation structure 101 can be further formed in the substrate 100. The transistors 102 are isolated from one another by the isolation structure 101. The isolation structure 101 is, for example, a shallow trench isolation (STI) structure. The material of the isolation structure 101 is, for example, a silicon oxide. The forming method of the isolation structure 101 is well-known to persons of ordinary skill in the art, and thus related description thereof is omitted hereinafter.

Subsequently, a dielectric layer 116 and conductive layers 118, 120 and 122 in the dielectric layer 116 are formed on the substrate 100. A dielectric layer 124 and conductive layers 126, 128 and 130 in the dielectric layer 124 are formed on the dielectric layer 116. A dielectric layer 132 and a conductive layer 134 in the dielectric layer 132 are formed on the dielectric layer 124. A dielectric layer 136 and a conductive layer 138 in the dielectric layer 136 are formed on the dielectric layer 132. The material of the dielectric layers 116, 124, 132, and 136 is, for example, a dielectric material such as a silicon oxide and so on. The forming method of the dielectric layers 116, 124, 132, and 136 is, for example, a chemical vapor deposition. The material of the conductive layers 118, 120, 122, 126, 128, 130, 134, and 138 is, for example, a conductive material such as tungsten, copper or aluminum and so on. The forming method of the conductive layers 118, 120, 122, 126, 128, 130, 134, and 138 may be a combination of a photolithography process, an etching process and a deposition process, or may be a damascene process.

The conductive layer 126 can be used as a word line and electrically connected to the gate 104 by the conductive layer 118. The conductive layer 128 can be used as a source line and electrically connected to the doped region 108 by the conductive layer 120. The conductive layers 122, 130, 134, and 138 can form an interconnect structure 140 connected to the doped region 110.

Then, a dielectric layer 142 is formed on the dielectric layer 136. The material of the dielectric layer 142 is, for example, a dielectric material, such as a silicon oxide and so on. The forming method of the dielectric layer 142 is, for example, a chemical vapor deposition.

Next, vias 144 are formed in the dielectric layer 142, and the vias 144 are connected to the interconnect structure 140. The material of the via 144 is, for example, tungsten, copper or aluminum. The forming method of the via 144 may be a combination of a photolithography process, an etching process and a deposition process, or may be a damascene process (e.g., a single damascene process).

Thereafter, a dielectric layer 146 is formed on the dielectric layer 142. The material of the dielectric layer 146 is, for example, a dielectric material, such as a silicon oxide and so on. The forming method of the dielectric layer 146 is, for example, a chemical vapor deposition.

Furthermore, vias 148 are formed in the dielectric layer 146, and the vias 148 are connected to the vias 144. The via 148 is electrically connected to the doped region 110 (i.e., a terminal) of the transistor 102 by the via 144. The material of the via 148 is, for example, tungsten, copper or aluminum. The forming method of the via 148 may be a combination of a photolithography process, an etching process and a deposition process, or may be a damascene process (e.g., a single damascene process). In addition, based on design requirements for process integration, persons of ordinary skill in the art can also have the via 148 and the via 144 under the via 148 formed at the same time by a dual damascene process.

In this embodiment, a width of the via 148 being greater than a width of the via 144 for example. Accordingly, since the width of the via 148 is greater than the width of the via 144, it is easier to perform an alignment on the via 144 subsequently formed on the via 148 (as shown in FIG. 3F). In addition, when an alignment deviation occurs on the via 148 and the via 144 (e.g., the leftmost via 148 and via 144), because the width of the via 148 is greater than that of the via 144, a short circuit can be prevent from happening between conductive lines 158a (which are subsequently formed at two sides of the via 148) and the via 144 (as shown in FIG. 3E).

In another embodiment, when the via 148 and the via 144 can be accurately aligned, the width of the via 148 can also be equal to the width of the via 144.

Figure 2B:
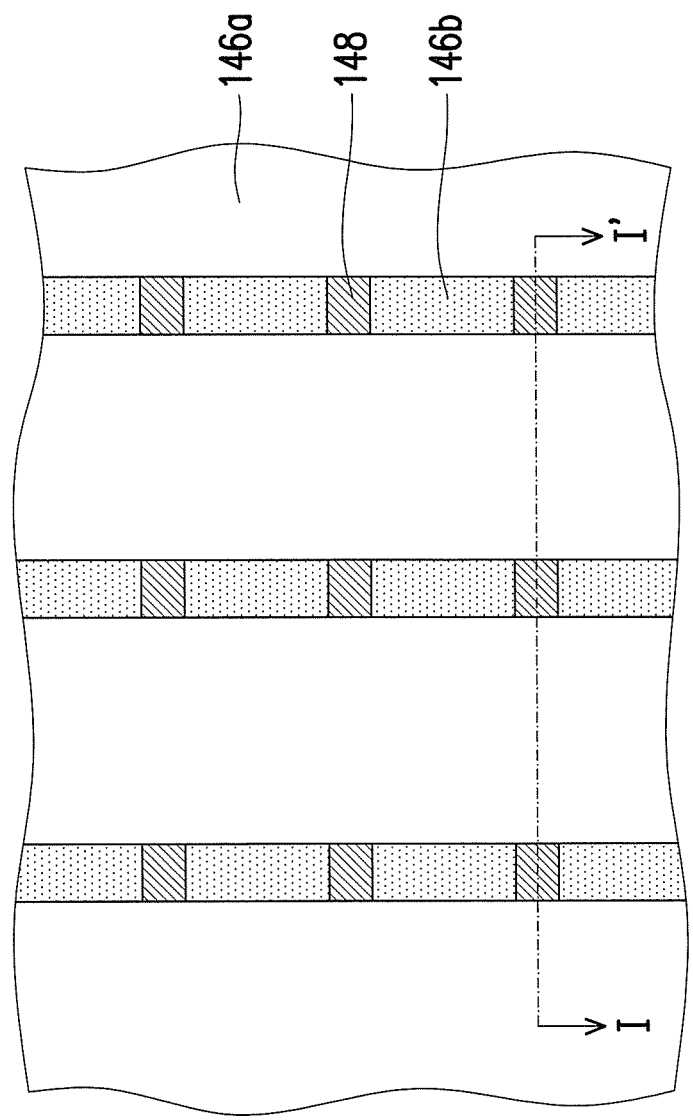
Figure 3B:
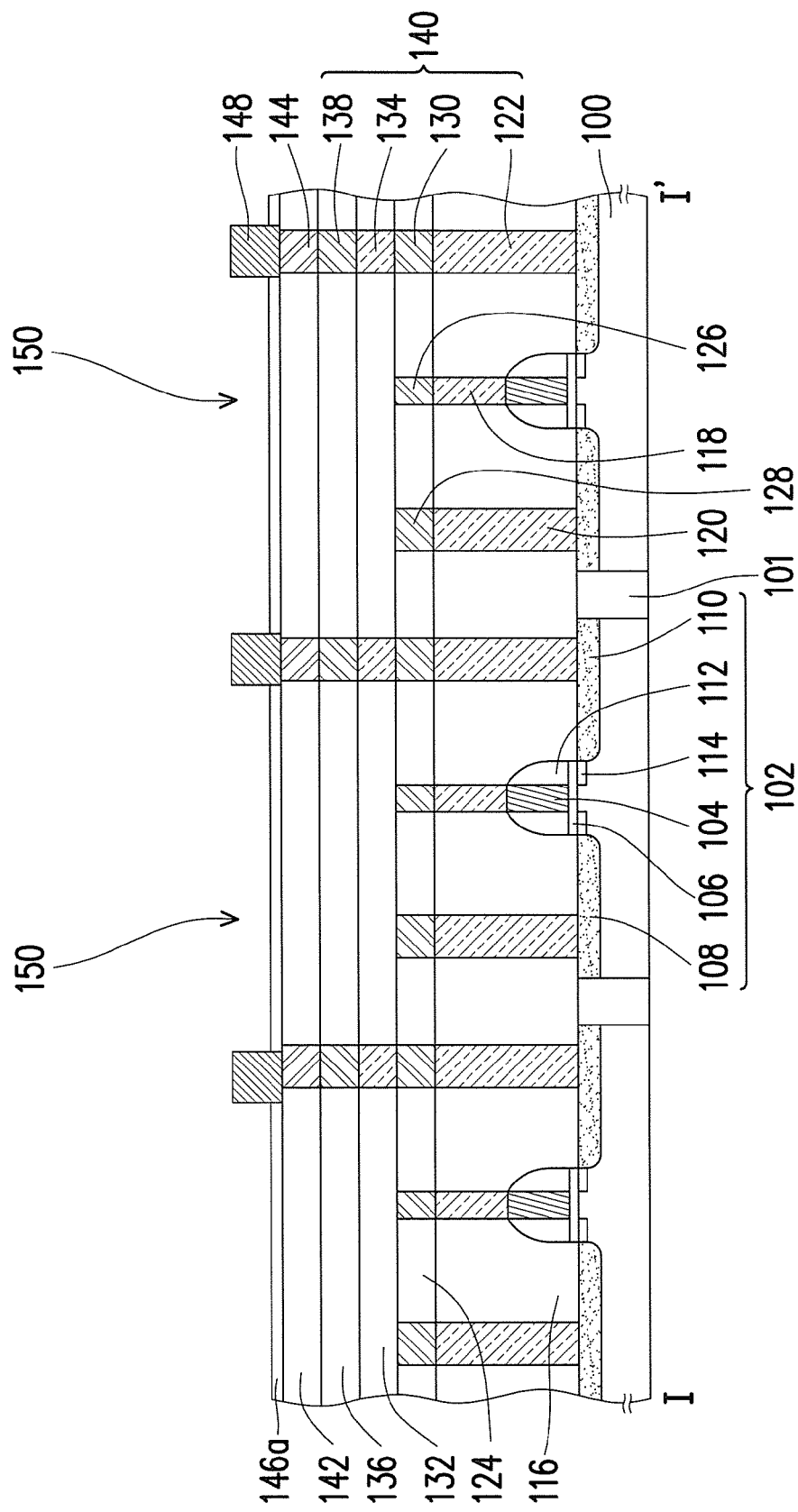

Further, referring to FIG. 1, FIG. 2B and FIG. 3B together, the dielectric layer 146 disposed at the two sides of the via 148 is removed in order to form an opening 150 at each of the two sides of the via 148. The forming method of the openings 150 is, for example, performing a patterning process on the dielectric layer 146 to partially remove the dielectric layer 146 at the two sides of the via 148, so as to form a dielectric layer 146a at the two sides of the via 148 and a dielectric layer 146b between the openings 150 (FIG. 2B). During performing the patterning process on the dielectric layer 146, a patterned photoresist layer (not illustrated) can be used to cover the dielectric layer 146b, such that the dielectric layer 146b and the dielectric layer 146 can maintain substantially the same thickness.

In this embodiment, the dielectric layer 146 at the two sides of the via 148 is partially removed, for example. That is, the dielectric layer 146a is formed in a condition where a removing depth of the dielectric layer 146 at the two sides of the via 148 is less than the thickness of the dielectric layer 146, such that a bottom portion of the opening 150 can be higher than a bottom surface of the via 148. Accordingly, when the alignment deviation occurs on the via 148 and the via 144 (e.g., the leftmost via 148 and via 144), because of the dielectric layer 146a, the short circuit can be prevent from happening between the conductive lines 158a (which are subsequently formed at the two sides of the via 148) and the via 144 (as shown in FIG. 3E).

In another embodiment, when the via 148 and the via 144 can be accurately aligned, the dielectric layer 146 at the two sides of the via 148 can also be completely removed. That is to say, a height of the bottom portion of the opening 150 can be equal to a height of the bottom surface of the via 148.

Figure 2C:
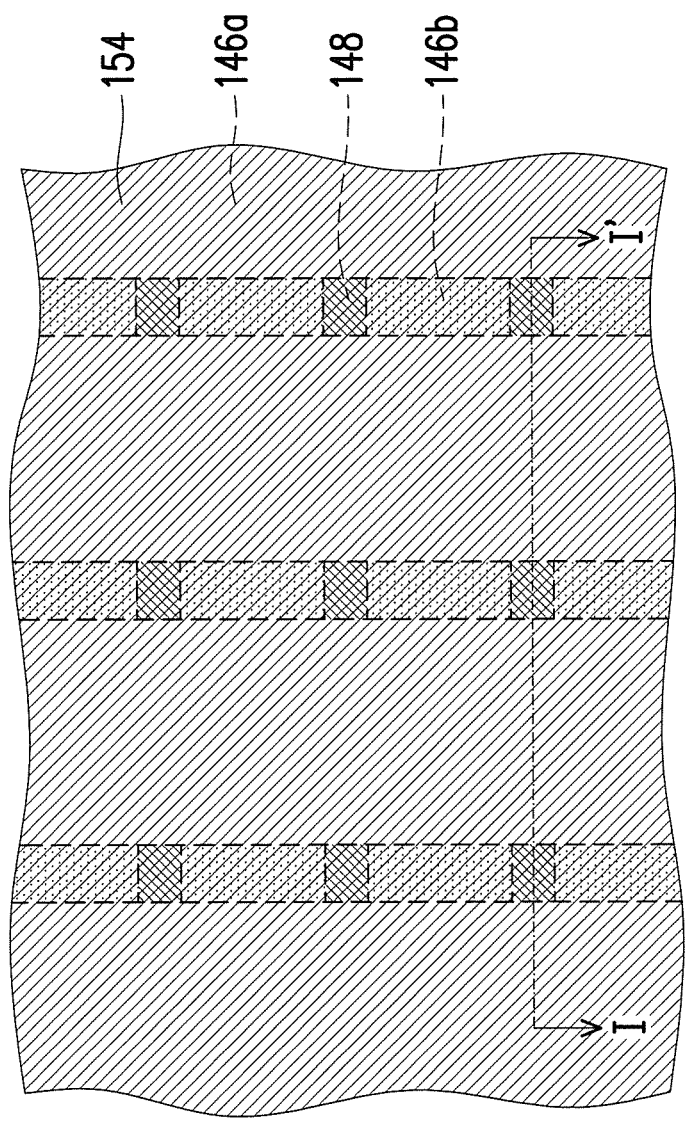
Figure 3C:
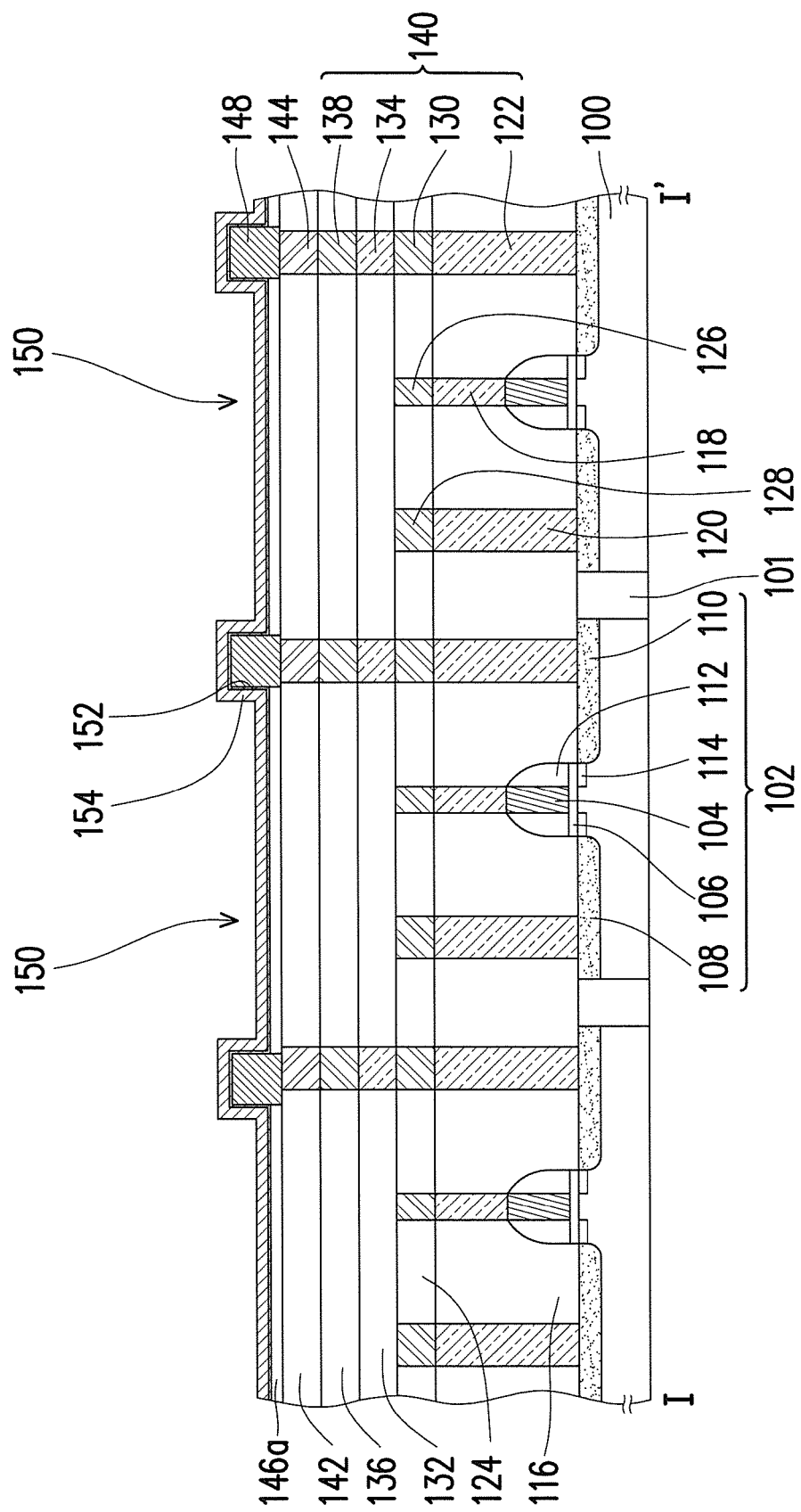

Thereafter, referring to FIG. 1, FIG. 2C and FIG. 3C together, a conformal insulation material layer 152 can be optionally formed on the vias 148, and the insulation material layer 152 can cover the dielectric layers 146a and 146b. The material of the insulation material layer 152 is, for example, an insulation material such as an oxide (e.g., a silicon oxide, etc.). The forming method of the insulation material layer 152 is, for example, a chemical vapor deposition.

Subsequently, a conformal variable resistance material layer 154 is formed on the insulation material layer 152. The material of the variable resistance material layer 154 is, for example, a metal oxide such as a hafnium oxide, a magnesium oxide, a nickel oxide, a niobium oxide, a titanium oxide, an aluminum oxide, a vanadium oxide, a tungsten oxide, a zinc oxide, or a cobalt oxide. The forming method of the variable resistance material layer 154 is, for example, a chemical vapor deposition. In this embodiment, the insulation material layer 152 is formed before the variable resistance material layer 154 is formed, for example. In another embodiment, the insulation material layer 152 can also be formed after forming the variable resistance material layer 154.

Figure 2D:
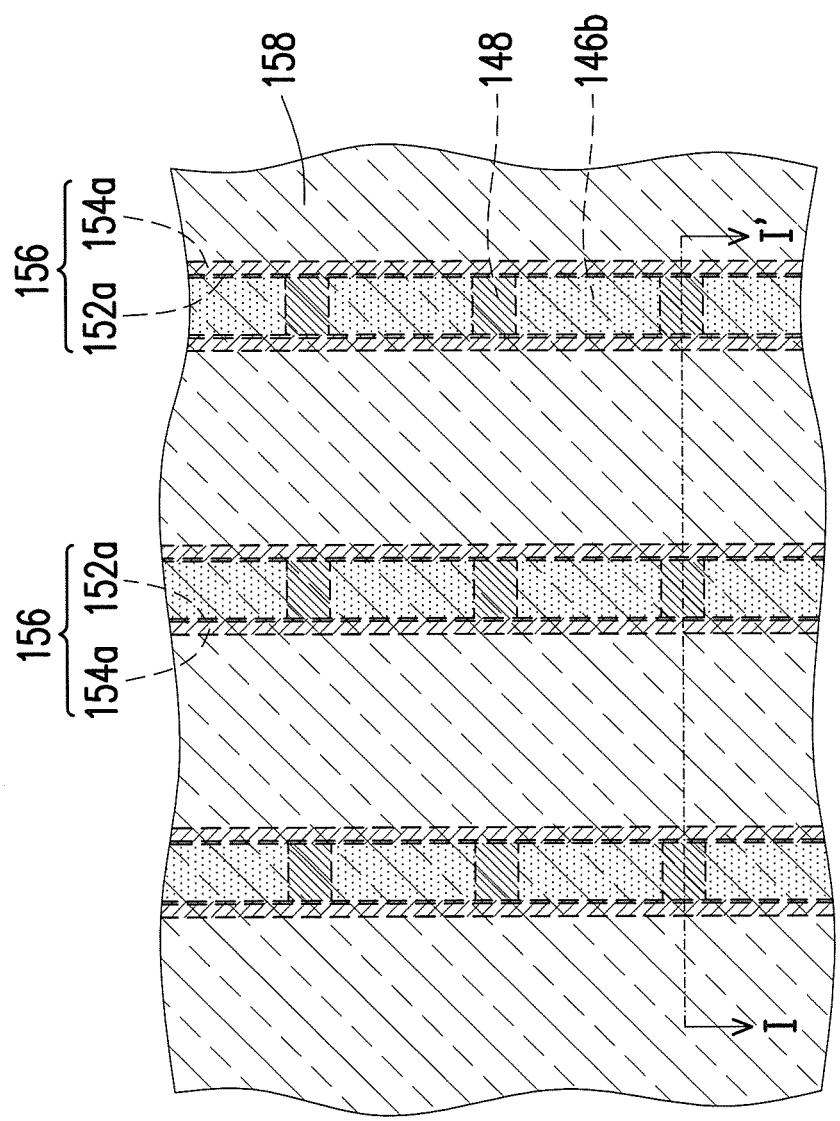
Figure 3D:
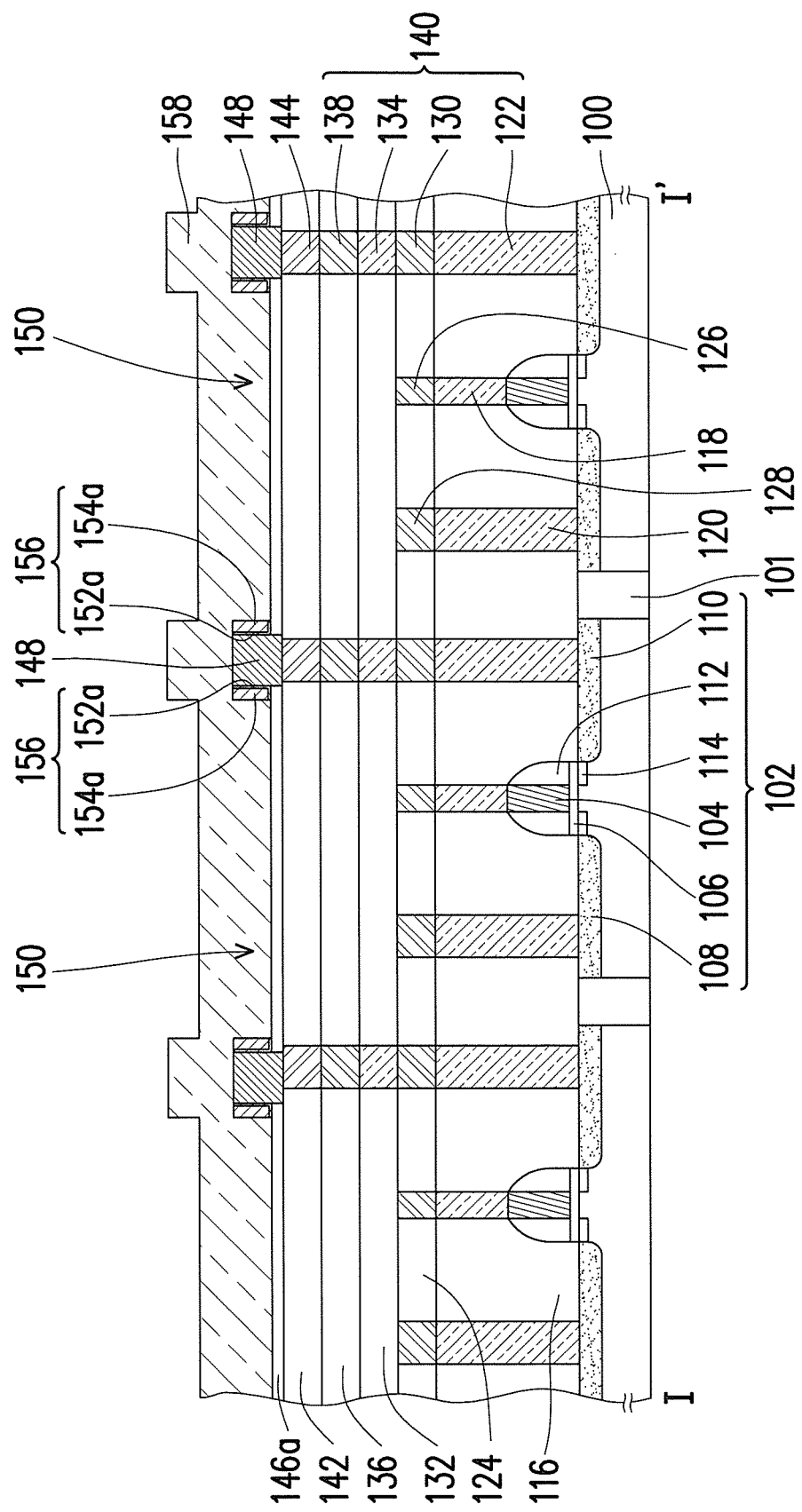
Figure 3E:
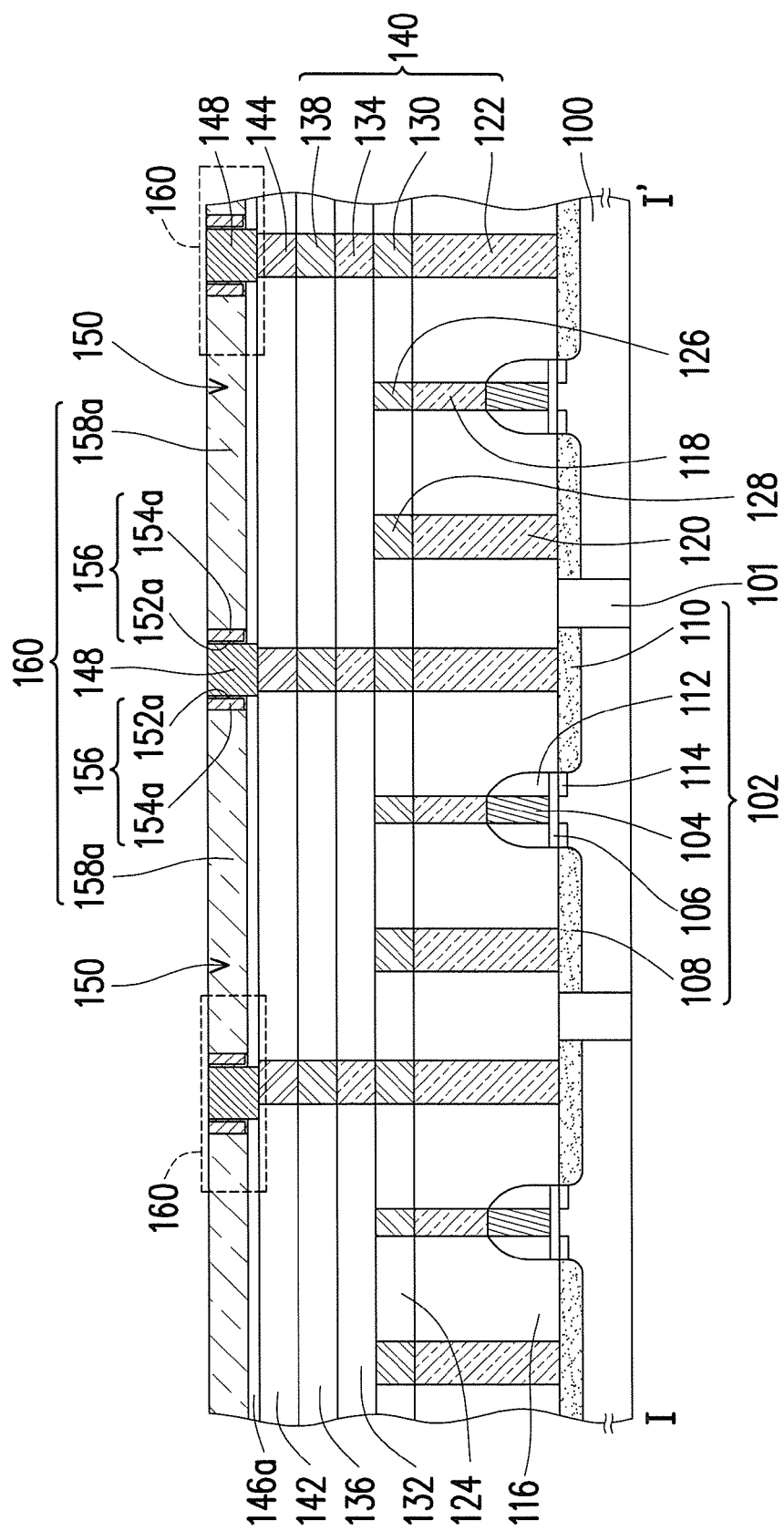
Figure 3F:
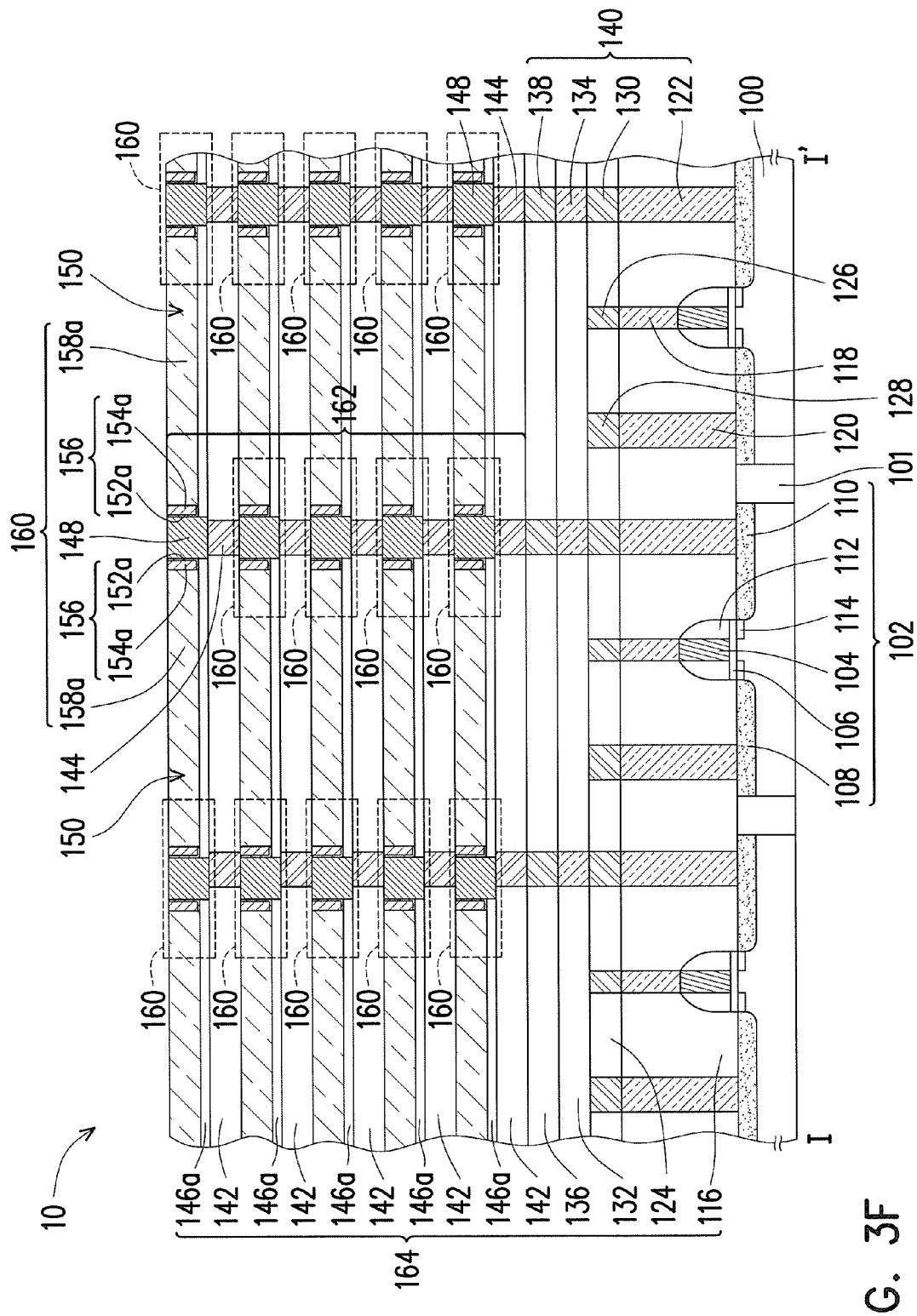

Then, referring to FIG. 1, FIG. 2D and FIG. 3D together, an etch-back process is performed on the variable resistance material layer 154 and insulation material layer 152, so as to respectively form a variable resistance layer 154a and an insulation layer 152a at the two sides of each of the vias 148. The variable resistance layer 154a and the insulation layer 152a can form a variable resistance structure 156. When the variable resistance structure 156 includes the insulation layer 152a, the variable resistance structure 156 is capable of functioning as a diode, so as to effectively block a sneak current thereby preventing occurrence of disturb.

Next, a conductive line material layer 158 filling the openings 150 is formed. The material of the conductive line material layer 158 is, for example, copper, tungsten or aluminum.

The forming method of the conductive line material layer 158 is, for example, an electroplating process or a chemical vapor deposition.

Figure 2E:
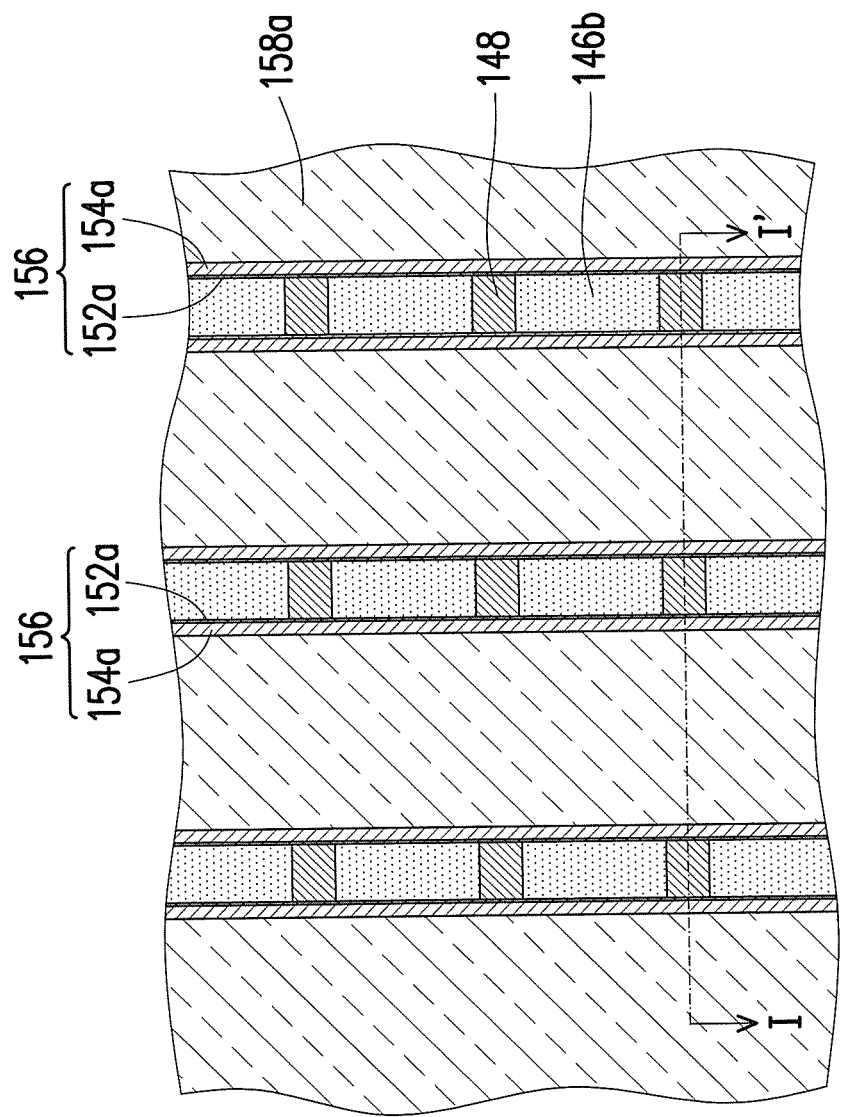

Thereafter, referring to FIG. 1, FIG. 2E and FIG. 3E together, conductive lines 158a are formed by removing the conductive line material layer 158 disposed outside of the openings 150. The method of removing the conductive line material layer 158 outside the openings 150 is, for example, a chemical mechanical polishing.

In this embodiment, because the bottom portion of the opening 150 is higher than the bottom surface of the via 148, a bottom surface of the conductive line 158a formed in the opening 150 can be higher than a top surface of the via 144 under the conductive line 158a. Accordingly, when the alignment deviation occurs on the via 148 and the via 144 (e.g., the leftmost via 148 and via 144), because the bottom surface of the conductive line 158a is higher than the top surface of the via 144 under the conductive line 158a, the short circuit can be prevent from happening between the conductive line 158a and the via 144. In another embodiment, when the via 148 and the via 144 can be accurately aligned, a height of the bottom surface of the conductive line 158a can also be equal to a height of the top surface of the via 144 under the conductive line 158a.

In this embodiment, a shape of the conductive lines 158a is illustrated as a strip shape for example, but the invention is not limited thereto. Persons of ordinary skill in the art can modify the shape of the conductive lines 158a based on design requirements. Referring to FIG. 4, in another embodiment, it is also possible that the odd-number conductive lines 158a are connected and the even-number conductive lines 158a are connected, such that the shape of conductive lines 158 can be a finger shape.

In addition, a memory cell 160 can be formed by the via 148, the conductive lines 158a at the two sides of the via 148, and the variable resistance structure 156 between the via 148 and the conductive lines 158a. Moreover, the variable resistance structure 156 at the two sides of the via 148 can be used as a memory unit so as to form a two bits per cell memory cell structure.

Figure 2F:
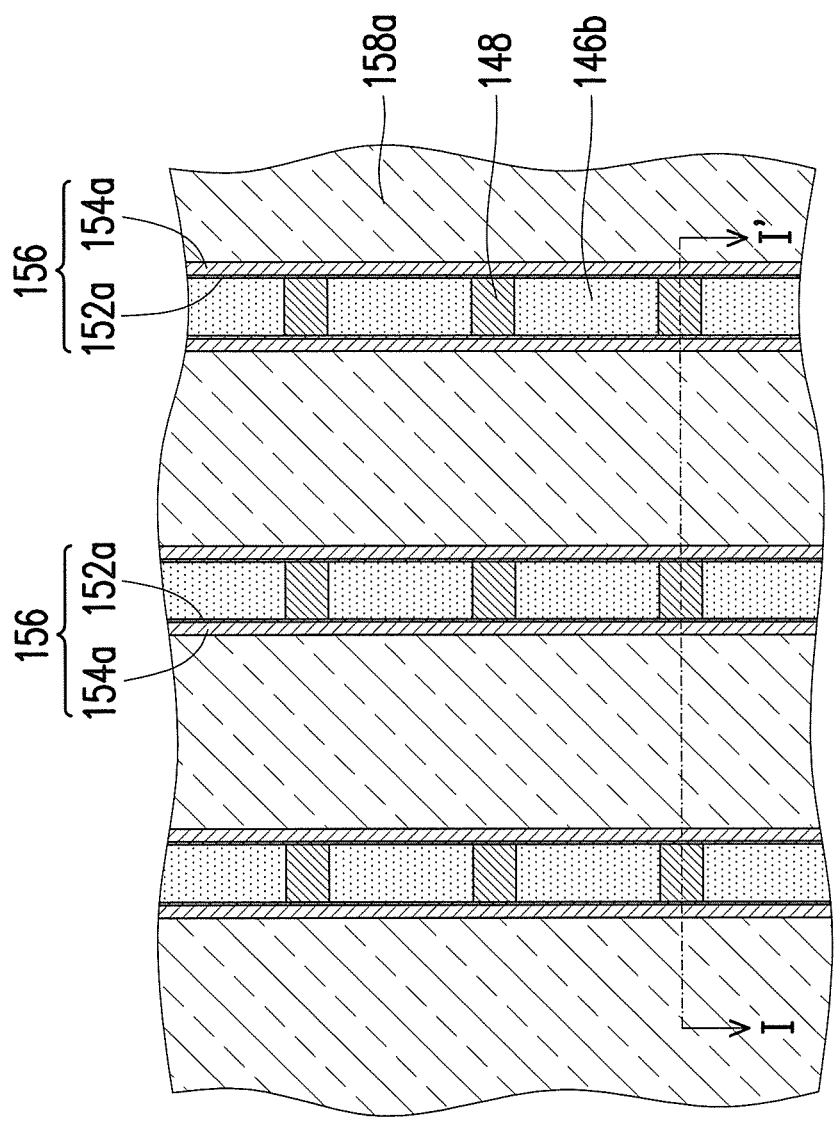

Furthermore, referring to FIG. 1, FIG. 2F and FIG. 3F together, the step of forming the vias 144 and the memory cells 160 can be performed repeatedly, and a memory cell string 162 can be formed by stacking the vias 144 and the memory cells 160 together. Persons of ordinary skill in the art can modify times of repeating the step of forming the vias 144 and the memory cells 160 based on design requirements of the product. In this embodiment, three memory cell strings 162 are formed, for example, but the invention is not limited thereto.

At this stage, a resistive random access memory 10 of one transistor driving n resistive memory cells (1T-NR) is completed by aforesaid manufacturing method. The resistive random access memory 10 according to the foregoing embodiments is a 3D resistive random access memory with arrangement in high density. In addition, because aforesaid manufacturing method does not require a deep etching process and a deep filling process to be performed, the manufacturing method can be directly integrated with the advanced logic process (e.g., a complementary metal oxide semiconductor (CMOS) logic process). Further, aforesaid manufacturing method is capable reducing a routing distance by minimizing a distance between the memory cell strings 162, so as to minimize a parasitic capacitance. On the other hand, because the manufacturing method of each layer of the memory cells 160 is simple, the production of the resistive random access memory 10 can be completed by simply repeating the manufacturing process.

Herein, a structure of the resistive random access memory 10 of the present embodiment is described with reference to FIG. 1, FIG. 2F, FIG. 3F and FIG. 4.

The resistive random access memory 10 includes a substrate 100, a dielectric layer 164 and at least one memory cell string 162. The dielectric layer 164 is disposed on the substrate 100. In this embodiment with reference to FIG. 3F, the dielectric layer 164 is, for example, formed by the dielectric layers 116, 124, 132, 136, 142 and 146a, but the invention is not limited thereto.

The memory cell string 162 includes a plurality of memory cells 160 and a plurality of vias 144. The memory cells 160 are vertically and adjacently disposed in the dielectric layer 164, and each of the memory cells 160 includes a via 148, two conductive lines 158a and two variable resistance structures 156. The conductive lines 158a are respectively disposed at two sides of the via 148. The shape of the conductive lines 158a can be a strip shape (as shown in FIG. 2E) or a finger shape (as shown in FIG. 4). The variable resistance structures 156 are respectively disposed between the via 148 and the conductive lines 158a. The variable resistance structure 156 includes a variable resistance layer 154a. The variable resistance structure 156 can further include an insulation layer 152a, disposed between the variable resistance layer 154a and the via 148. In another embodiment, the insulation layer 152a can also be disposed between the variable resistance layer 154a and the conductive lines 158a. In the vertically adjacent two memory cells 160, the variable resistance structures 156 of the upper memory cell 160 and the variable resistance structures 156 of the lower memory cell 160 are isolated from each other. The vias 144 are respectively disposed in the dielectric layer 164 under the vias 148 and connected to the vias 148, and the vertically adjacent two vias 148 are connected by the via 144. When there is a plurality of memory cell strings 162, the horizontally adjacent two memory cells 160 share the conductive line 158a disposed therebetween.

In this embodiment, a width of the via 148 is greater than a width of the via 144, for example. In another embodiment, a width of the via 148 can also be equal to a width of the via 144.

In this embodiment, a bottom surface of the conductive line 158a is higher than a top surface of the via 144 under the conductive line 158a. In another embodiment, a height of the bottom surface of the conductive line 158a can also be equal to a height of the top surface of the via 144 under the conductive line 158a.

The resistive random access memory 10 can further include at least one transistor 102. The transistor 102 is disposed on the substrate 100. A doped region 110 (i.e., a terminal) of the transistor 102 can be electrically connected to the via 148 by an interconnect structure 140 and the via 144, but a method of electrically connecting the transistor 102 and the via 148 is not limited only to the above. In this embodiment, although the transistor 102 is illustrated as a planar transistor for example, the invention is not limited thereto. In other embodiments, the transistor 102 can also adopt a vertical transistor to further reduce a wafer area occupied by the transistor 102 thereby improving space utilization. In addition, when there is a plurality of transistors 102, the resistive random access memory 10 can further include at least one isolation structure 101. The isolation structure 101 is disposed in the substrate 100, and the transistors 102 are isolated from one another by the isolation structure 101.

Furthermore, the resistive random access memory 10 can optionally include at least one source line 166. The material of the source line 166 is, for example, copper, tungsten or aluminum. The forming method of the source line 166 is, for example, a damascene process. The source line 166 can be electrically connected to the conductive layer 128 by a plug 168.

Moreover, the material, the disposition, the forming method and the effectiveness of each component in the resistive random access memory 10 have been described in aforesaid manufacturing method of FIG. 3A to FIG. 3F, which are not repeated hereinafter.

In summary, characteristics of the resistive random access memory 10 in the foregoing embodiments are listed as follows. In the vertically adjacent two memory cells 160, the variable resistance structures 156 of the upper memory cell 160 and the variable resistance structures 156 of the lower memory cell 160 are isolated from each other, and the vertically adjacent two vias 148 are connected by the via 144. Therefore, a deep etching process and a deep filling process are not required during the manufacturing process of the resistive random access memory 10. Accordingly, the manufacturing process can be directly integrated with the advanced logic process (e.g., the complementary metal oxide semiconductor (CMOS) logic process).

Although the present invention has been described with reference to the above embodiments, it will be apparent to one of ordinary skill in the art that modifications to the described embodiments may be made without departing from the spirit of the invention. Accordingly, the scope of the invention will be defined by the attached claims and not by the above detailed descriptions.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A resistive random access memory, comprising:
a substrate;
a dielectric layer, disposed on the substrate; and
at least one memory cell string, comprising:
  a plurality of memory cells, vertically and adjacently disposed in the dielectric layer, wherein the memory cells comprise a plurality of first vias, a plurality of conductive lines and a plurality of variable resistance structures, and each of the memory cells comprises:
    a first via;
    two conductive lines, respectively disposed at two sides of the first via; and
    two variable resistance structures, respectively disposed between the first via and the conductive lines, wherein
    in the vertically adjacent two memory cells, the variable resistance structures of the upper memory cell and the variable resistance structures of the lower memory cell are isolated from each other; and
  a plurality of second vias, respectively disposed in the dielectric layer under the first vias and connected to the first vias, wherein the vertically adjacent two first vias are connected by one of the second vias.

2. The resistive random access memory of claim 1, wherein a width of the first vias is greater than a width of the second vias.

3. The resistive random access memory of claim 1, wherein a bottom surface of each of the conductive lines is higher than a top surface of each of the second vias under the conductive lines.

4. The resistive random access memory of claim 1, wherein each of the variable resistance structures comprises a variable resistance layer.

5. The resistive random access memory of claim 4, wherein each of the variable resistance structures further comprises an insulation layer, disposed between the variable resistance layer and each of the first vias or between the variable resistance layer and each of the conductive lines.

6. The resistive random access memory of claim 1, wherein when the at least one memory cell string is a plurality of memory cell strings, the horizontally adjacent two memory cells share the conductive line disposed therebetween.

7. The resistive random access memory of claim 1, wherein a shape of the conductive lines comprises a strip shape or a finger shape.

8. The resistive random access memory of claim 1, further comprising at least one transistor, disposed on the substrate, wherein one terminal of the at least one transistor is electrically connected to one of the first vias by one of the second vias.

9. The resistive random access memory of claim 8, wherein when the at least one transistor is a plurality of transistors, the resistive random access memory further comprises at least one isolation structure disposed in the substrate, wherein the transistors are isolated from one another by the at least one isolation structure.

10. A method for manufacturing a resistive random access memory, comprising:
forming a dielectric layer on a substrate; and
forming at least one memory cell string in the dielectric layer, wherein the at least one memory cell string comprises:
  a plurality of memory cells, vertically and adjacently disposed in the dielectric layer, wherein the memory cells comprise a plurality of first vias, a plurality of conductive lines and a plurality of variable resistance structures, and each of the memory cells comprises:
    a first via;
    two conductive lines, respectively disposed at two sides of the first via; and
    two variable resistance structures, respectively disposed between the first via and the conductive lines, wherein
    in the vertically adjacent two memory cells, the variable resistance structures of the upper memory cell and the variable resistance structures of the lower memory cell are isolated from each other; and
  a plurality of second vias, respectively disposed in the dielectric layer under the first vias and connected to the first vias, wherein the vertically adjacent two first vias are connected by one of the second vias.

11. The method for manufacturing the resistive random access memory of claim 10, wherein a forming method of the dielectric layer comprises a chemical vapor deposition.

12. The method for manufacturing the resistive random access memory of claim 10, wherein a forming method of the first vias comprises a combination of a photolithography process, an etching process and a deposition process, or comprises a damascene process.

13. The method for manufacturing the resistive random access memory of claim 10, wherein a width of the first vias is greater than a width of the second vias.

14. The method for manufacturing the resistive random access memory of claim 10, wherein a forming method of each of the conductive lines comprises:
 removing the dielectric layer at the two sides of each of the first vias in order to form an opening at each of the two sides of each of the first vias;
 forming a conductive line material layer filling the openings; and
 removing the conductive line material layer disposed outside of the openings.

15. The method for manufacturing the resistive random access memory of claim 14, wherein a bottom portion of each of the openings is higher than a bottom surface of each of the first vias.

16. The method for manufacturing the resistive random access memory of claim 10, wherein a forming method of the variable resistance structures comprises:
 forming a conformal variable resistance material layer on the first vias; and
 performing an etch-back process on the variable resistance material layer.

17. The method for manufacturing the resistive random access memory of claim 16, wherein the forming method of the variable resistance structures further comprises before or after forming the variable resistance material layer, forming a conformal insulation material layer on the first vias.

18. The method for manufacturing the resistive random access memory of claim 10, wherein a forming method of the second vias comprises a combination of a photolithography process, an etching process and a deposition process, or comprises a damascene process.

19. The method for manufacturing the resistive random access memory of claim 10, further comprising before forming the dielectric layer, forming at least one transistor on the substrate, wherein one terminal of the at least one transistor is electrically connected to one of the first vias by one of the second vias.

20. The method for manufacturing the resistive random access memory of claim 19, wherein when the at least one transistor is a plurality of transistors, the manufacturing method of the resistive random access memory further comprises forming at least one isolation structure in the substrate, wherein the transistors are isolated from one another by the at least one isolation structure.

\* \* \* \* \*